(12) United States Patent
Verschuren et al.

(10) Patent No.: US 12,259,659 B2
(45) Date of Patent: Mar. 25, 2025

(54) ALIGNING A DISTORTED IMAGE

(71) Applicant: ASML Netherlands B.V., Veldhoven (NL)

(72) Inventors: Coen Adrianus Verschuren, Eindhoven (NL); Scott Anderson Middlebrooks, Duizel (NL); Maxim Pisarenco, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 375 days.

(21) Appl. No.: 17/963,063

(22) Filed: Oct. 10, 2022

(65) Prior Publication Data
US 2023/0036630 A1    Feb. 2, 2023

Related U.S. Application Data

(63) Continuation of application No. PCT/EP2021/058546, filed on Mar. 31, 2021.

(30) Foreign Application Priority Data

Apr. 10, 2020 (EP) .................................... 20169199

(51) Int. Cl.
*G06T 7/00* (2017.01)
*G03F 7/00* (2006.01)
(Continued)

(52) U.S. Cl.
CPC .............. *G03F 7/705* (2013.01); *G06T 7/001* (2013.01); *G06V 10/754* (2022.01);
(Continued)

(58) Field of Classification Search
CPC ..... G03F 7/705; G03F 7/70616; G06T 7/001; G06T 2207/20084; G06T 2207/30148;
(Continued)

(56) References Cited

U.S. PATENT DOCUMENTS

| | | | |
|---|---|---|---|
| 10,984,284 B1 * | 4/2021 | Corcoran | G06V 30/40 |
| 2012/0008127 A1 | 1/2012 | Tel et al. | |

(Continued)

FOREIGN PATENT DOCUMENTS

| | | |
|---|---|---|
| CN | 106548210 A | 3/2017 |
| TW | 201800983 A | 1/2018 |

(Continued)

OTHER PUBLICATIONS

Office Action of the Intellectual Property Office issued in related Taiwanese Patent Application No. 110112088; mailed May 6, 2022 (22 pgs.).

(Continued)

*Primary Examiner* — Samir A Ahmed
(74) *Attorney, Agent, or Firm* — Finnegan, Henderson, Farabow, Garrett & Dunner, LLP

(57) ABSTRACT

A method for determining an optimized weighting of an encoder and decoder network; the method comprising:
for each of a plurality of test weightings, performing the following steps with the encoder and decoder operating using the test weighting:
(a) encoding, using the encoder, a reference image and a distorted image into a latent space to form an encoding;
(b) decoding the encoding, using the decoder, to form a distortion map indicative of a difference between the reference image and a distorted image;
(c) spatially transforming the distorted image by the distortion map to obtain an aligned image;
(d) comparing the aligned image to the reference image to obtain a similarity metric; and
(e) determining a loss function which is at least partially defined by the similarity metric;

(Continued)

wherein the optimized weighting is determined to be the test weighting which has an optimized loss function.

15 Claims, 7 Drawing Sheets

(51) Int. Cl.
  *G06V 10/75* (2022.01)
  *G06V 10/764* (2022.01)
  *G06V 10/82* (2022.01)
  *G06V 10/24* (2022.01)

(52) U.S. Cl.
  CPC ............ *G06V 10/764* (2022.01); *G06V 10/82* (2022.01); *G06T 2207/20084* (2013.01); *G06T 2207/30148* (2013.01); *G06V 10/247* (2022.01)

(58) Field of Classification Search
  CPC ... G06T 5/60; G06T 5/80; G06T 2207/10061; G06T 2207/20081; G06V 10/754; G06V 10/764; G06V 10/82; G06V 10/247; G06V 2201/06; G06N 3/045; G06N 3/08; H01J 37/222
  See application file for complete search history.

(56) References Cited

U.S. PATENT DOCUMENTS

| | | |
|---|---|---|
| 2018/0293721 A1 | 10/2018 | Gupta et al. |
| 2018/0330511 A1 | 11/2018 | Ha et al. |
| 2019/0139208 A1 | 5/2019 | Chen et al. |
| 2019/0214223 A1* | 7/2019 | Pathangi Sriraman ..................... G06N 3/045 |
| 2019/0259145 A1 | 8/2019 | Kong et al. |
| 2019/0318202 A1* | 10/2019 | Zhao ..................... G06F 18/214 |
| 2020/0265211 A1* | 8/2020 | Nasrabadi ............ G06V 10/764 |
| 2021/0174491 A1* | 6/2021 | Pisarenco ................. G03F 1/86 |
| 2021/0216697 A1* | 7/2021 | Van Den Brink .... G06F 30/398 |

FOREIGN PATENT DOCUMENTS

| | | |
|---|---|---|
| TW | 201939564 A | 10/2019 |
| TW | 202001447 A | 1/2020 |
| TW | 202006346 A | 2/2020 |

OTHER PUBLICATIONS

International Search Report from the International Search Authority issued in related International Application No. PCT/EP2021/058546 mailed Jun. 23, 2021 (2 pgs.).

* cited by examiner

ALIGNING A DISTORTED IMAGE

CROSS-REFERENCE TO RELATED APPLICATIONS

This application claims priority of International application PCT/EP2021/058546, which was filed on Mar. 31, 2021, and claims priority of EP application 20169199.5, which was filed on Apr. 10, 2020, both of which are incorporated herein by reference in their entireties.

FIELD

The embodiments of the present disclosure relate to methods for determining the operation of an encoder-decoder network and for aligning a distorted image using an encoder-decoder network, in particular for device manufacturing using lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Most semiconductor devices require a plurality of pattern layers to be formed and transferred onto the substrate. For proper functioning of the device, there is usually a limit on the tolerable error in the positioning of edges, quantified in an edge placement error or EPE. EPE can arise because of errors in the relative positioning of successive layers, known as overlay, or due to errors in the dimensions (specifically the critical dimension or CD) of features. With the continual desire in the lithographic art to reduce the size of features that can be formed (shrink), the limits on EPE are becoming stricter.

Overlay can arise from a variety of causes in the lithographic process, for example errors in the positioning of the substrate during exposure and aberrations in the projected image. Overlay can also be caused during process steps, such as etching, which are used to transfer the pattern onto the substrate. Some such process steps generate stresses within the substrate that lead to local or global distortions of the substrate. The formation of three-dimensional structures on the substrate, such as is required for recently developed memory types and MEMS, can also lead to significant distortions of the substrate. CD variation can also derive from a variety of causes, including dose or focus errors.

SUMMARY

The present disclosure aims to enable more accurate metrology, e.g. for use in lithographic device manufacturing processes.

According to some embodiments, there is provided a method for determining an optimized weighting of an encoder and decoder network; the method comprising:
for each of a plurality of test weightings, performing the following steps with the encoder and decoder operating using the test weighting:
(a) encoding, using the encoder, a reference image and a distorted image into a latent space to form an encoding;
(b) decoding the encoding, using the decoder, to form a distortion map indicative of a difference between the reference image and a distorted image;
(c) spatially transforming the distorted image by the distortion map to obtain an aligned image;
(d) comparing the aligned image to the reference image to obtain a similarity metric; and
(e) determining a loss function which is at least partially defined by the similarity metric;
wherein the optimized weighting is determined to be the test weighting which has an optimized loss function.

According to some embodiments, there is provided a method for aligning a distorted image, the method comprising:
using an encoder-decoder network operating with an optimized weighting determined according to the method above and performing the following:
encoding, using the encoder, a reference image and a distorted image into a latent space to form an encoding;
decoding, using the decoder, the encoding to form an optimized distortion map; and
spatially transforming the distorted image using the distortion map so as to obtain an aligned image.

According to some embodiments, there is provided a method for aligning a distorted image, the method comprising:
using a pre-trained encoder-decoder network trained to decode from the latent space to produce a distortion map and performing the following for each of a plurality of different test latent vectors:
spatially transforming the distorted image based on the test latent vector to provide a test aligned image;
comparing the test aligned image to a reference image;
obtaining a similarity metric based on the comparison of the aligned image and reference image;
determining an optimized latent vector which corresponds to the test latent vector which provides an optimized similarity metric;
determining an optimized distortion map by decoding the optimized latent vector with the pre-trained decoder; and
spatially transforming the distorted image by the optimized distortion map to output an aligned image.

According to some embodiments, there is provided an inspection tool comprising:
an imaging system configured to image a portion of a semiconductor substrate; and
an image analysis system configured to perform the method for aligning a distorted image according to any of the methods described above.

According to some embodiments, there is provided a method of manufacture of a semiconductor substrate, the method comprising the steps of:
manufacturing at least part of the semiconductor substrate;
performing the method according to any of the methods described above for aligning a distorted image;
analyzing the aligned image to obtain a metric of the image; and comparing the metric to a target metric and taking remedial action when the metric does not meet the target metric.

BRIEF DESCRIPTION OF THE DRAWINGS

Embodiments will now be described, by way of example, with reference to the accompanying drawings.

DETAILED DESCRIPTION

Figure 1:
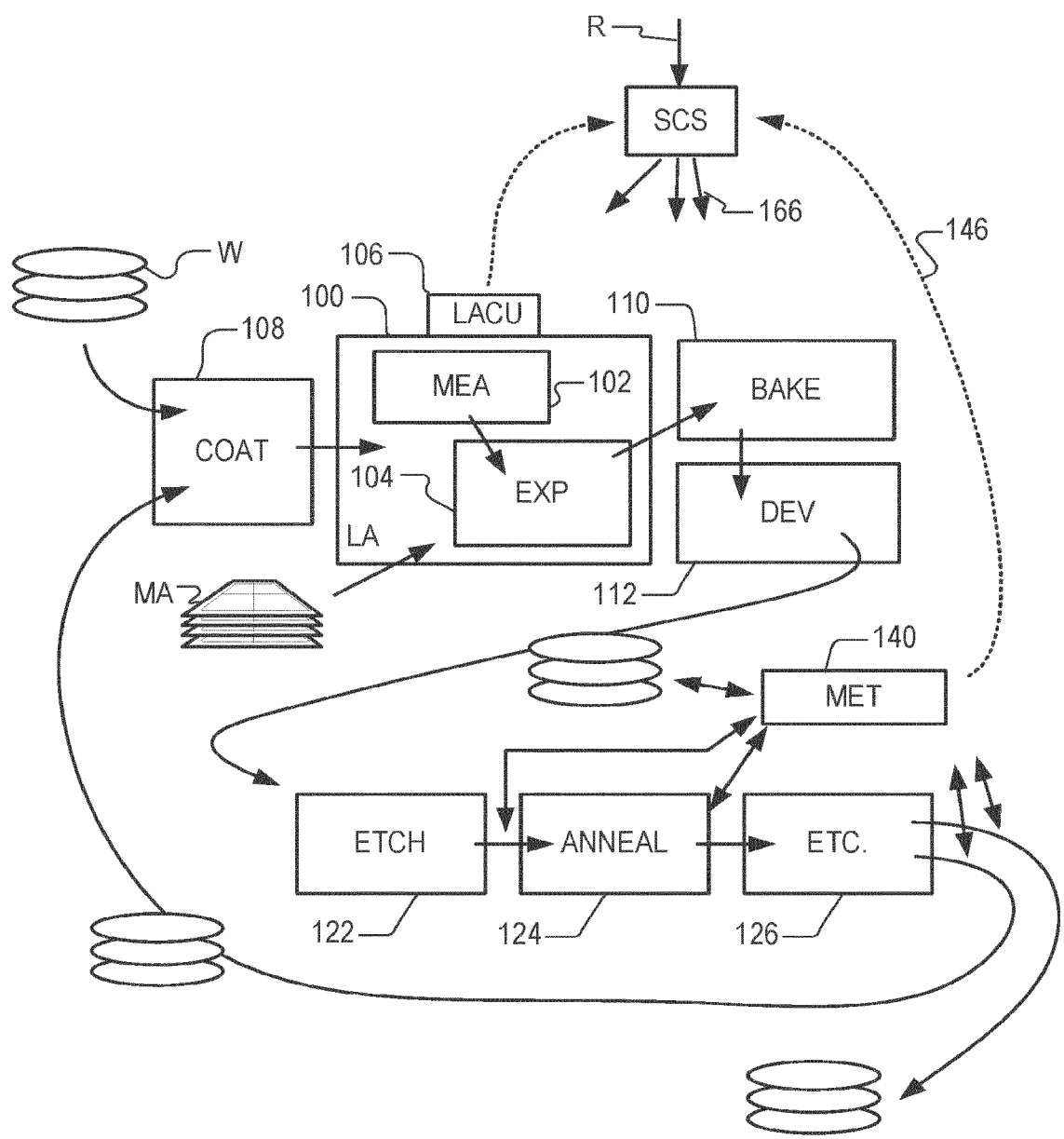
FIG. 1 depicts a lithographic apparatus together with other apparatuses forming a production facility for semiconductor devices.

Electronic devices are constructed of circuits typically formed on a piece of silicon called a substrate, which may be referred to as a semiconductor substrate. Of course any other suitable material may be used for the substrate. Many circuits may be formed together on the same piece of silicon and are called integrated circuits or ICs. The size of these circuits has decreased dramatically so that many more of them can fit on the substrate. For example, an IC chip in a smartphone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning electron microscope (SEM), an optical inspection system, etc. Such systems can be used to image these structures, in effect, taking a "picture" of the structures of the wafer, with a SEM being able to image the smallest of these structures. The image can be used to determine if the structure was formed properly in the proper location. If the structure is defective, then the process can be adjusted, so the defect is less likely to recur.

In order to control errors in a lithographic manufacturing process, such as errors in the relative position of features in different layers (known as overlay) and the size of features (known as CD variation), it is necessary to measure the errors, such as by use of a scanning electron microscope (SEM), an optical inspection system, etc., before corrections can be applied. When using a SEM or other inspection system, images of the substrate are typically obtained and the size of features on the substrate are measured from the images. This allows, for example, determination of CD variation or EPE. However, the images obtained by inspection systems, for example a SEM, are often distorted. Such distortions may, for example, comprise field of view (FOV) distortions which arise as a result of limitations in the electron optical design (similar to e.g. pincushion and barrel distortion in optical systems), as well as effects due to charging (electron beam—sample interaction, leading to e.g. beam bending). As a result of the distortions, measurements of features on the substrate may not be wholly accurate and thus the distortions may introduce an error in the measurements. Given the small tolerances in the measurements of the features on such substrates, errors of this type are less than desirable and may cause the implementation of changes to the manufacturing process which are either not necessary or which are too extreme. One of the current solutions for achieving alignment of the distorted image includes sub-pixel alignment of the distorted image to a reference image. However, this process is extremely computational expensive and thus not suited for the processing of large numbers of distorted images.

Some methods disclosed herein are directed towards using an encoder-decoder network configured to produce a distortion map which may be used to transform a distorted image into an aligned image, with the distortions at least partially removed therefrom. Measurements may then be performed using the aligned image and the accuracy of the measurements may be increased. This may therefore improve the monitoring of the chip making process.

A method disclosed herein comprises determining the weightings, e.g. operational parameters, of an encoder-decoder network such that the encoder-decoder network can take a reference image and a distorted image as an input and output a distortion map representative of the distortion between the distorted image and reference image. This method comprises iterating over a range of test weightings until a distortion map is found which, when applied to the distorted image, returns an aligned image which is similar to the reference image. This method works on the basis that it is known that the aligned image should be similar to the reference image. Another method is disclosed herein which utilizes a pre-trained encoder-decoder network which may be trained by encoding a plurality of different input distortion maps into a latent space and decoding the encodings to obtain a decoded distortion map. Again, with the aim of the decoded distortion map being as similar possible to the input distortion maps, the weightings of the encoder and decoder may be determined. Once trained, given a reference image and distorted image, the difference between a reference image and the distorted image transformed by a number of different latent vectors may be found. Once a maximum similarity has been determined, the optimal latent vector may be decoded by the trained decoder to return the distortion map. This distortion map can then be applied to the distorted image to return an aligned image.

Before describing embodiments in detail, it is instructive to present an example environment in which the techniques disclosed herein may be implemented.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles or other shapes aligned in accordance with a Cartesian two-dimensional coordinate system (e.g. aligned along an X and a Y-axis, both axes being orthogonal to each other).

A requirement on the lithographic apparatus is an accurate reproduction of the desired pattern onto the substrate. The positions and dimensions of the applied product features need to be within certain tolerances. Position errors may give rise to an overlay error (often referred to as "overlay"). The overlay is the error in placing a first product feature within a first layer relative to a second product feature within a second layer. The lithographic apparatus reduces the overlay errors by aligning each wafer accurately to a reference prior to patterning. This is done by measuring positions of alignment marks which are applied to the substrate. Based on the alignment measurements the substrate position is controlled during the patterning process in order to prevent occurrence of out of tolerance overlay errors. Alignment marks are typically created as part of the product image, forming the reference to which overlay is measured. Alternatively, alignment marks of a previously formed layer can be used.

An error in a critical dimension (CD) of the product feature may occur when the applied dose associated with the exposure 104 is not within specification. For this reason the lithographic apparatus 100 must be able to accurately control the dose of the radiation applied to the substrate. The exposure 104 is controlled by the measurement tool 102 which is integrated into the lithographic apparatus 100. CD errors may also occur when the substrate is not positioned correctly with respect to a focal plane associated with the pattern image. Focal position errors are commonly associated with non-planarity of a substrate surface. The lithographic apparatus reduces these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process, the patterned substrates are inspected by a metrology apparatus 140. Common examples of a metrology apparatus are scatterometers and scanning electron microscopes. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. A CD metrology target is used for measuring the result of the most recently exposed layer. An overlay target is used for measuring the difference between the positions of the previous and most recent layers. An electron beam (e-beam) based inspection tool, such as a scanning electron microscope (SEM) may be well suited for the measurement of small overlay and CD values.

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus 140 is configured to inspect substrates after development at development apparatus 112, or after further processing (e.g. etching at etching station 122). The various apparatuses within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback, corrective actions are determined to improve processing quality of subsequent substrates. The SCS can be one computer or multiple computers, which may or may not communicate. The recipe R can be implemented as one recipe or as multiple independent recipes. For example, the recipe for a process step such as etch may be totally independent of the recipe to inspect the result of that process step (e.g. etch). For example, two or more recipes for individual steps may be interrelated such that one recipe is adjusted to take account of the results of performance of another recipe on the same or a different substrate.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data, characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example, context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

To qualify the process window, separate CD and overlay measurements are performed with one or more of the existing tools and combined into an edge placement error (EPE) budget. Often, one metrology step might be performed after development (ADI) and another after an etch step (AEI), and there are inherent difficulties in calibrating two such different measurements to give equivalent results.

EPE is very important to ensure that a semiconductor device is working properly, for example it may affect whether, in a back end of line module, there is sufficient electrical contact. This makes EPE measurements very valuable to ensuring that the process window accommodates a sufficient EPE budget and to controlling the process to remain within window.

Figure 2:
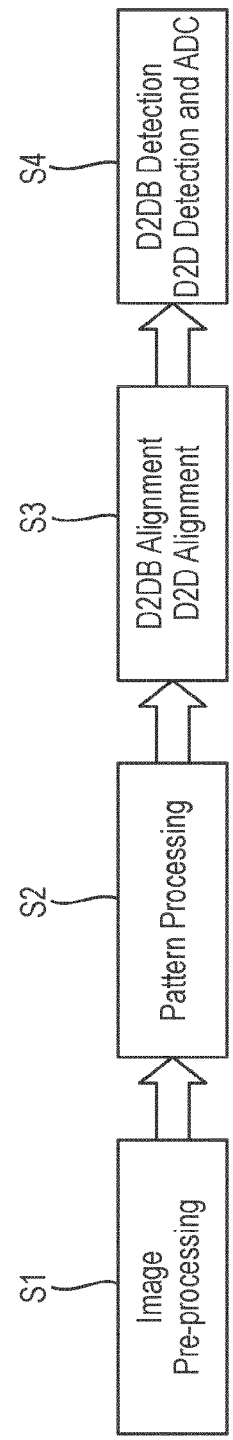
FIG. 2 depicts a flow chart illustrating a method for determining defects in an image.

The metrology apparatus 140 may obtain images of the semiconductor substrate in order to inspect and obtain measurements of the substrate. However, as mentioned previously, the image obtained by the metrology apparatus may be distorted. FIG. 2 shows a flow chart illustrating the typical processing of an image for determining defects therein, which includes means for addressing the issue of image distortion. Taking an image obtained using the suitable metrology apparatus 140, which may comprise a SEM, an image pre-processing step S1 is performed. The pre-processing of the image may, for example, comprise any number of suitable pre-processing steps. The pre-processing may comprise image noise estimation, image focus index calculation, image quality enhancement (EQE), of a substrate for determining defects therein. Once this pre-processing has been performed, pattern processing is performed in step S2. The pattern processing may, for example, comprise global alignment of the image. Following global alignment, local alignment in step S3 is performed. This local alignment may comprise die-to-die (D2D) or die-to-database (D2DB) alignment. This local alignment may correct for problems such as distortion or charging. Following alignment in step S3, the final step of default detection is performed in step S4. In this step S4, defect detection and classification may be performed. This may, for example, comprise measuring features of the image to work out CDs or EPEs. These CDs and EPEs may then be compared to predetermined metrics to determine the presence and extent of defects on the substrate.

Field of view (FOV) distortions and charging artefacts affect the direct measurement and comparison of structures in different parts of the field, or between different images if the field of view changes. Prior art techniques for performing local alignment comprise sub-pixel alignment on small patches of images after the global alignment step S2 has been performed. Global alignment may, for example, be on the order of approximately 10 nm. However, this method for local alignment is computationally intensive. As a result, in order to perform such processing, expensive computation systems are required. Furthermore, in the case of a metrology apparatus using a SEM, the computational requirement scales with the number of beams used and soon becomes infeasible.

Some methods disclosed herein aim to address the above problem associated with local alignment and provide an alternative mechanism for achieving local alignment which is less computationally intensive.

Figure 3:
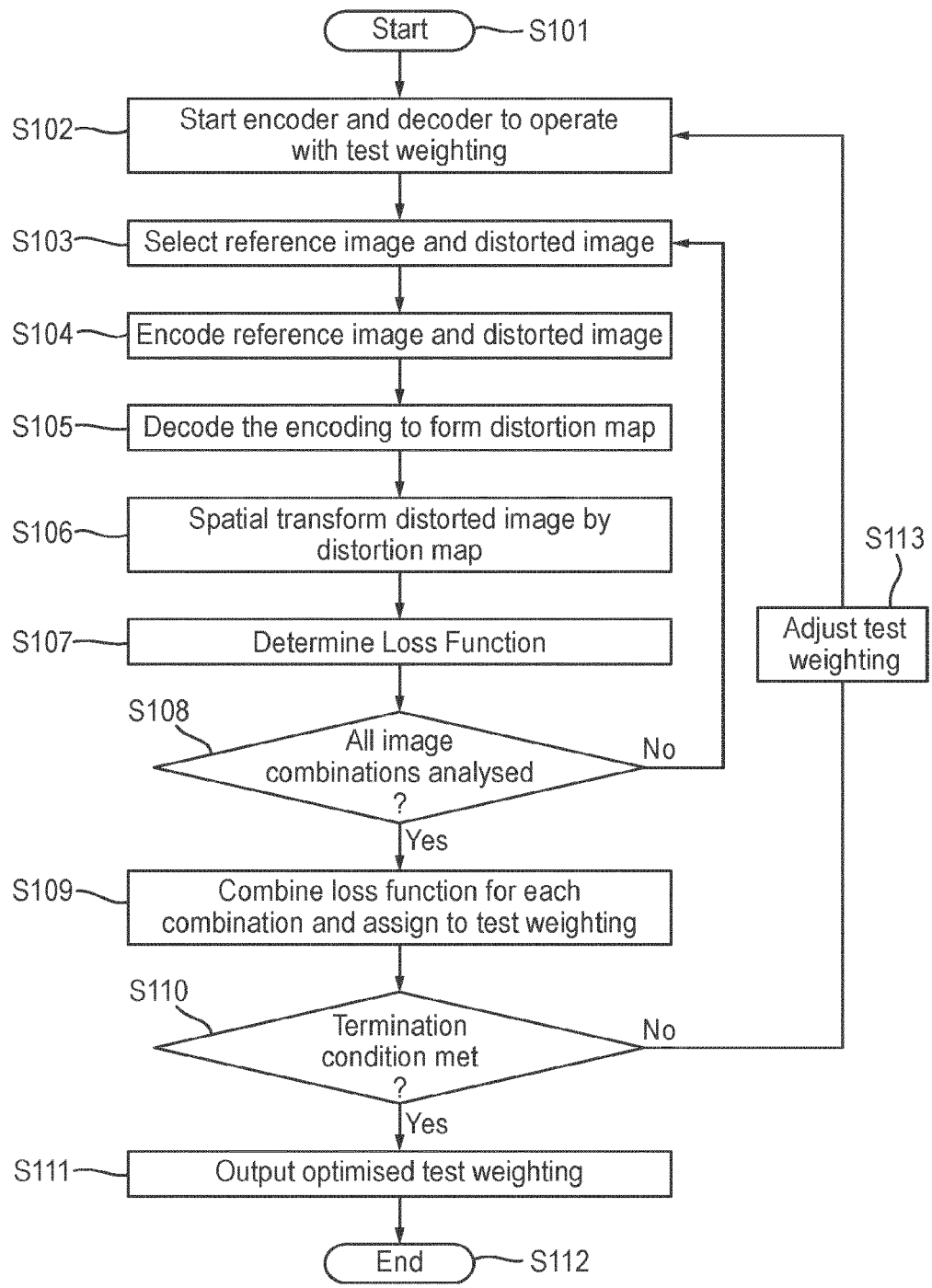
FIG. 3 depicts a flow chart illustrating a method for setting the weightings of an encoder-decoder network.
Figure 4:
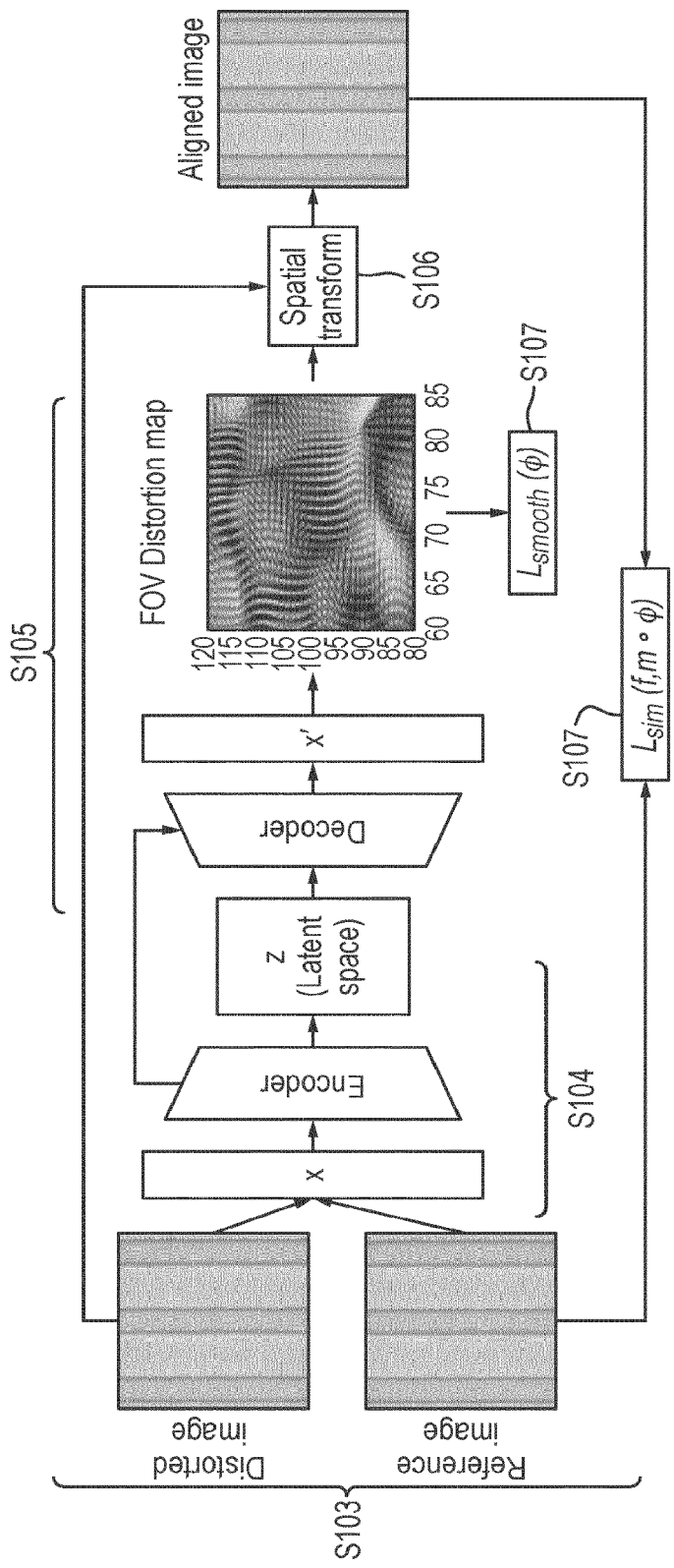
FIG. 4 is a schematic illustration of the method shown in FIG. 3 in the exemplary case of a reference image and distorted image of a semiconductor substrate.

Alignment of a distorted image may be performed using an encoder-decoder network which is configured to encode into, and decode out of, a latent space. There is disclosed herein a method for determining an optimized weighting of an encoder and decoder network; which may perform this purpose. Such a method is illustrated in the flow chart of FIG. 3. Some of the steps of the flowchart of FIG. 3 are also depicted schematically in FIG. 4. The following is with reference to both FIGS. 3 and 4. The method is initiated at step S101. Steps S102-S110 are iterated to find an optimized test weighting for the encoder-decoder network. In the first iteration of step 102 the encoder and decoder of the network are set to operate with an initial test weighting. The initial test weighting can be selected using a variety of methods. For example all values may be set to maximum, minimum or mid-range values, to random values or to values obtained from a previous use of the method. Step S103 comprises selecting a reference image and a distorted image for analyzing. In step S104, the reference image and distorted image are encoded, using the encoder, into a latent space to form an encoding. Following this step, step S105 is performed in which the encoding is decoded by the decoder to form a distortion map indicative of a difference between the reference image and the distorted image. Once the distortion map has been formed, the distorted image is spatially transformed the by the distortion map to obtain an aligned image in step S106.

With the aligned image obtained, a loss function is determined in step S107. The loss function is at least partially defined by a similarity metric which is obtained by comparing the aligned image to the reference image. The loss metric may be obtained by inputting the reference image and the aligned image into a discriminator network which outputs values depending on the similarity of the images. For example, the network may output values close to 0 for similar inputs and close to 1 for inputs that are significantly different. Of course any metric may be used.

The loss function may also be at least partially defined by a smoothness metric which is defined by the smoothness of the distortion map. Accordingly, the step of determining the loss function in step S107 may further comprise determining a smoothness metric of the distortion map. This smoothness metric shown schematically in FIG. 4 as $L_{smooth}(\varphi)$. The smoothness metric may be defined by any suitable measurement of the distortion map which is representative of smoothness. In an example, the smoothness metric is at least partially defined by the spatial gradients of the distortion map. Images of semiconductor substrates that are obtained using a SEM are known to display distortions of the first, second and sometimes the third order. Accordingly, by optimizing the smoothness of the distortion map, i.e. maximizing its smoothness, it may be possible to set the weighting of the encoder-decoder network such that an appropriate distortion map can be generated. Higher frequency distortions can be due to actual differences in the measured geometry of the distorted image, when compared to the reference image, if the distorted image and reference image are obtained from different locations on a substrate, or to noise, and so it may not be desirable to form a distortion map which corrects for these differences. This ensures that the distortion map is indicative of the distortions in the image, rather than other differences between the reference image and the distorted image. In some cases it is expected that the aligned image may have some differences to the reference image, for example if the aligned and reference images are obtained from different places on a substrate or are derived from different modalities (e.g. comparing an SEM image to a mask image, GDSII, or a simulated image).

The method may be performed using only a single reference image and a single distorted image. However, to obtain an encoder-decoder network which is more robust and capable of more accurately aligning a distorted image, the process may be repeated for a number of different combinations of reference images and distorted images. Therefore, the method may include step S108, which involves determining whether all of the appropriate image combinations have been analyzed. If this is not the case, for each test weighting, steps S103 to S107 are repeated for a plurality of different combinations of reference images and distorted images. Any combination of reference images and distorted images may be utilized. For example, the plurality of combinations may comprise combinations of at least one reference image with a plurality of different distorted images. A plurality of different reference images may be used. For example, the plurality of combinations may comprise combinations of a plurality of different reference images with a plurality of different distorted images. Increasing the number of combinations of reference image (s) and distorted images may result in a better optimized test weighting.

Once these steps have been performed for all of the appropriate combinations, the method may then proceed to step S109 in which the loss function for a given test weighting is based on a combination of the loss functions determined for each of the different combinations of reference and distorted images. The loss function for each combination may be combined in any suitable manner. For example, the loss function for each combination may be summed together to provide a total loss function for a particular test weighting.

Having carried out the above method for a particular test weighting, at step S110 it is determined whether a termination condition has been met. The termination condition can be one or more of the following conditions: a predetermined value for the loss function has been achieved; the improvement in the loss function compared to previous iterations is below a predetermined value; a local minimum in the loss function has been found; and a predetermined number of iterations has been performed. If the termination condition is not met, the test weighting is adjusted in step S113 and the method returns to step S102, and the process described above is repeated, except with a different test weighting. In step S113, the values of the test weighting are adjusted in a manner which is predicted to minimize the loss function. In some embodiments a random component may also be added to prevent the optimization routine becoming trapped in a local minimum.

The loss function L, may thus be determined according to the following equation:

$$L = \underset{w}{\mathrm{argmin}} \sum_i L_{sim}(f_i, m_i \circ \phi(f_i, m_i, w)) + L_{smooth}((\phi(f_i, m_i, w)) \quad (1)$$

in which w is a particular weighting, $L_{sim}$ is the similarity metric, $L_{smooth}$ is the smoothness metric, f is the reference image, m is the distorted image and $\phi$ is the distortion map. The loss function for each weighting is the sum of the similarity metric and smoothness metric for each image combination, i.

Once all the necessary test weightings have been iterated over, the method proceeds to step S111 in which the optimized weighting is determined to be the test weighting which has an optimized loss function. The weighting of the encoder-decoder network is then set as the optimized weighting and the method ends at step S112.

The method described above may not need to iterate over all test weightings if for a particular test weighting, or for a set of test weightings, the loss function indicates that an optimized weighting has been found. For example, the loss function may reach a certain level which is pre-set as being indicative of an optimized weighting. Similarly, the loss function for a plurality of test weightings may indicate the presence of an optimized weighting, without further iterations being performed. For example, the loss function may be minimized for a particular test weighting, and subsequently increase for other test weightings. Based on this information alone, it may be possible to determine that the test weighting which provided the minimized loss function is the optimized weighting without requiring further iterations of other test weightings.

The optimized loss function may depend on the reference image and the aligned image, particularly the type of alignment which is being performed. The optimized loss function may correspond to a maximum similarity between the aligned image and the reference image.

The method described above may be unsupervised and it may not be necessary to provide a ground truth distortion map for each pair of reference and distorted images. This is beneficial because it simplifies the process of training such a model, since only pairs of SEM images are needed and not distortion maps.

The method described above may utilize reference images which are obtained from a database. Images from the database may be upscaled, pixelized and transformed into a simulated image, for example simulated SEM image.

The method described above for determining the weightings of the encoder-decoder network effectively provides a global optimization of the weighting for the encoder-decoder network. Whilst this determination of the optimized weightings may be relatively computationally expensive, it may be performed offline prior to analysis of distorted images of interest. Further, once performed, it provides an encoder-decoder network which is extremely fast in determining a distortion map for a given pair of reference and distorted images. The process may be orders of magnitude faster than prior art techniques. Its evaluation is extremely fast. The use of shared weights w ensures that the generated distortion maps are consistent for different patterns, under the same true distortion.

Another advantage of the method described above is that determining the optimized weighting over larger field of views (vs small patches) has the additional advantage of improved robustness and accuracy. This is because all relevant data is taken into account, strongly reducing the impact of e.g. noise and discretization errors. Actual distortions are spatially relatively very smooth compared to noise/discretization errors and even device features. Therefore, when 'fitting' such distortions over a large range and with very many data points, the resulting 'fit error' averages out and strongly reduces as compared to a situation where a distortion is only determined locally over a small range.

The method described above relates to the setting of the weightings of an encoder-decoder network. There is further disclosed a method using an encoder-decoder network for aligning a distorted image utilizing an encoder-decoder network with its weightings set according to the methods described above. In a first step the method comprises encoding, using the encoder, a reference image and a distorted image into a latent space to form an encoding. Following this, the step of decoding, using the decoder, the encoding to form an optimized distortion map is performed. Next, the step of spatially transforming the distorted image using the distortion map so as to obtain an aligned image is performed. This method substantially corresponds to the method described above with reference to FIGS. 3 and 4, except without the optimization of the weightings and the repetition for different image combinations. These steps correspond to steps S104, S105, S106 described above, with the encoder-decoder network operating with the optimized test weighting.

Figure 5:
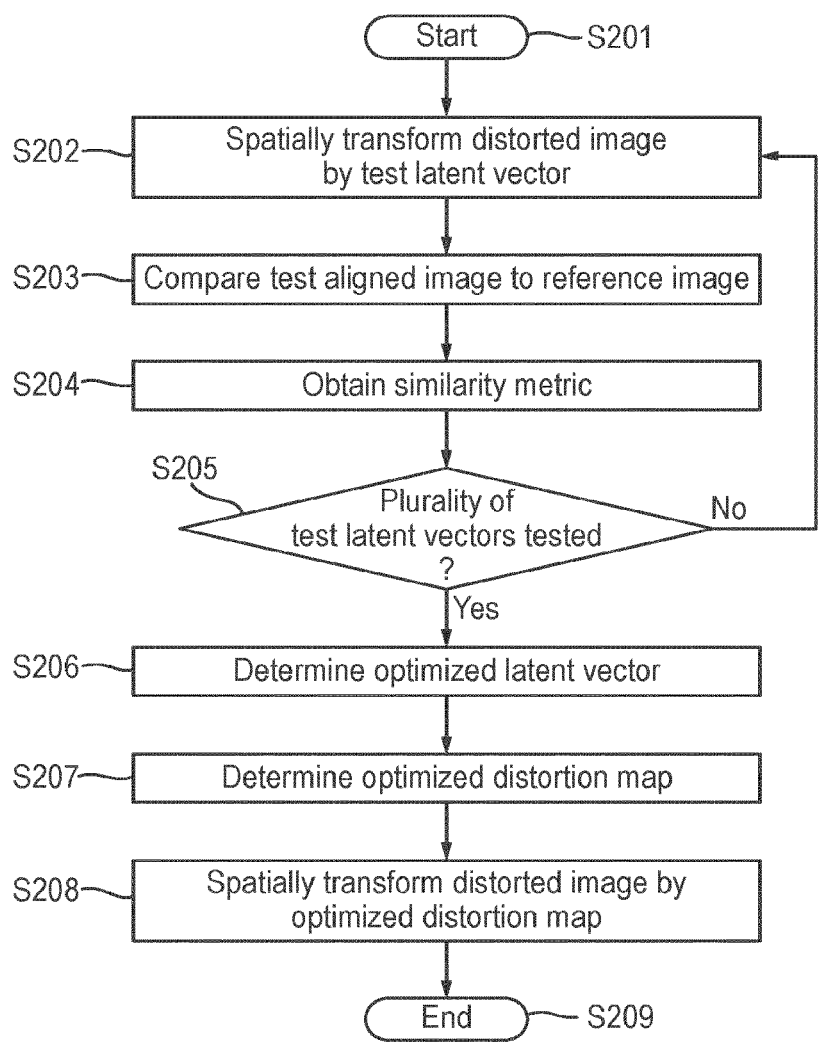
FIG. 5 depicts a flow chart illustrating a method for obtaining an aligned image.

The methods described above relate to the training of an encoder-decoder network and to the use of such a network in encoding a reference image and distorted image into a latent space and outputting a distortion map for transforming the distorted image. Also disclosed herein is a further method for aligning a distorted image. This further method is illustrated in FIG. 5. The method uses a pre-trained encoder-decoder network trained to decode from the latent space to produce a distortion map.

The method is initiated in step S201. Following initiation, a distorted image is spatially transformed based on a test latent vector to provide a test aligned image in step S202. Once the test aligned image has been determined, the test aligned image is compared to a reference image in step S203. Following the comparison, a similarity metric is obtained in step S204. The similarity metric is based on the comparison of the aligned image and the reference image. The specific form of the similarity metric may depend on the type of comparison that is performed. At step S205, it is determined whether the plurality of test latent vectors have been tested and if not, the process returns to step S202 and steps S202 to S204 are repeated. It may not be necessary to analyze all of the test latent vectors if an optimal similarity metric is determined before testing all of the test latent vectors.

Once sufficient test latent vectors have been processed, the method proceeds to step S206, which comprises determining an optimized latent vector that corresponds to the test latent vector which results in an optimum value of the similarity metric. The optimized similarity metric may be preset before the beginning of the process, e.g. it may be the similarity metric which is below a certain level, or it may be the similarity metric which corresponds to the most similar aligned image to the reference image. With the optimized latent vector determined, an optimized distortion map is determined in step S207. This is achieved by decoding the optimized latent vector with the pre-trained decoder. In step S208, the distorted image is spatially transformed by the optimized distortion map to output an aligned image. The process then ends at step S209. This method effectively utilizes a distribution of distortion maps that are encoded into the latent space in order to determine the appropriate distortion map for a given pair of reference and distorted images. By performing the optimization in the latent space, the dimensionality of the optimization problem is reduced, thus making the process less computationally expensive. Through performing the optimization in the latent space, this may allow gradient-based optimization to efficiently guide the search for the optimized latent vector.

The similarity metric in this method may be any suitable metric that is indicative of the similarity between the reference image and the test aligned image. For example, the similarity metric obtained in step S204 above may be determined by squaring the difference between the reference image and the test aligned image. In this case, the similarity metric will be smaller the more similar the test aligned image is to the reference image. Therefore, in this case, the optimized latent vector may correspond to the test latent vector for which the similarity metric is minimized. The process described above for finding the optimized latent vector, z*, in the case of squaring the difference between the reference image and aligned image is described mathematically in the following equation:

$$z^* = \underset{z \in R^k}{\operatorname{argmin}} \|f - m \circ D(z)\|^2 \quad (2)$$

in which $R^k$ is the k-dimensional real-valued space of latent vectors, f is the reference image, m is the distorted image and D(z) is the distortion map obtained by decoding z using the pre-trained encoder-decoder network. As described above, once the optimized latent vector, z* is found (e.g. using a gradient descent or similar algorithm), the estimated distortion map is computed by a forward pass of the solution through the decoder.

Figure 6:
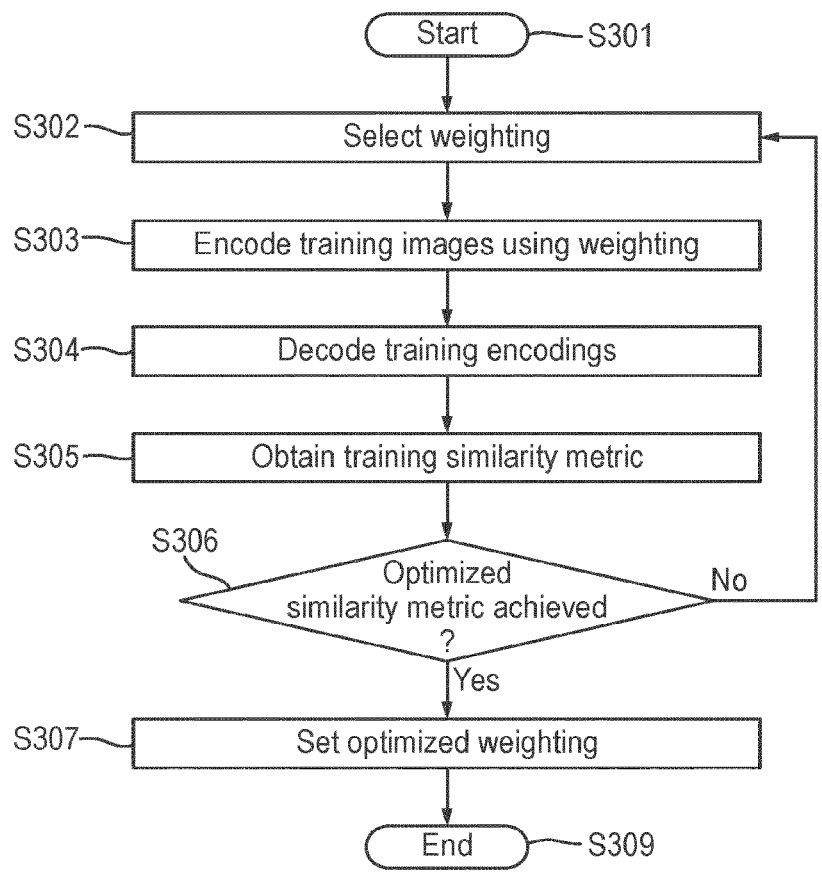
FIG. 6 depicts a flow chart illustrating a method for training an encoder-decoder network of the type utilized in the method of FIG. 5.

The pre-trained encoder-decoder network used in the method described above may be trained by any suitable means such that it is capable of encoding and decoding the images in the required manner. FIG. 6 is a flowchart depicting an exemplary method for training the pre-trained encoder-decoder. The training is initiated in step S301. Following initiation, a weighting of the encoder-decoder network is set in step S302. This weighting determines how the encoder encodes into the latent space and how the decoder decodes out of the latent space. With the weighting set, training images are encoded into a latent space to form training encodings in step S303.

The training encodings are then decoded in step S304 to form decoded images. The decoded images are then compared to the training images initially encoded by the encoder, so as to obtain a training similarity metric. In step S306, it is determined whether the weighting has resulted in an optimized similarity metric. If this is not the case, the process returns to step S302 and a different test weighting is used and steps S302 to S306 are repeated for as many different weighting as is necessary until an optimized similarity metric is achieved. Once an optimized similarity metric is obtained, the weighting which achieves this optimized similarity metric is used to set the weighting of the encoder-decoder network. These steps therefore form part of the pre-training of the encoder-encoder network. Desirably the auto-encoder is variational, in which case it is able to predict multiple outputs for a single input. Those multiple outputs can be seen as samples coming from a distribution. If the network is certain about the output, all the outputs will be very similar (distribution with low variance). If the network is uncertain about the output, the outputs will be less similar to each other (distribution with high variance). Therefore it is possible to determine the certainty of the prediction generated by the network.

The training similarity metric may be based on a loss function which is classical, or a metric which is learned directly from the data using a discriminator network. The discriminator network learns to distinguish between real and fake distortion maps, thereby generating a learned similarity metric; the more real the image is predicted to be by the discriminator, the more similar it is to the ground truth (and vice versa).

Figure 7:
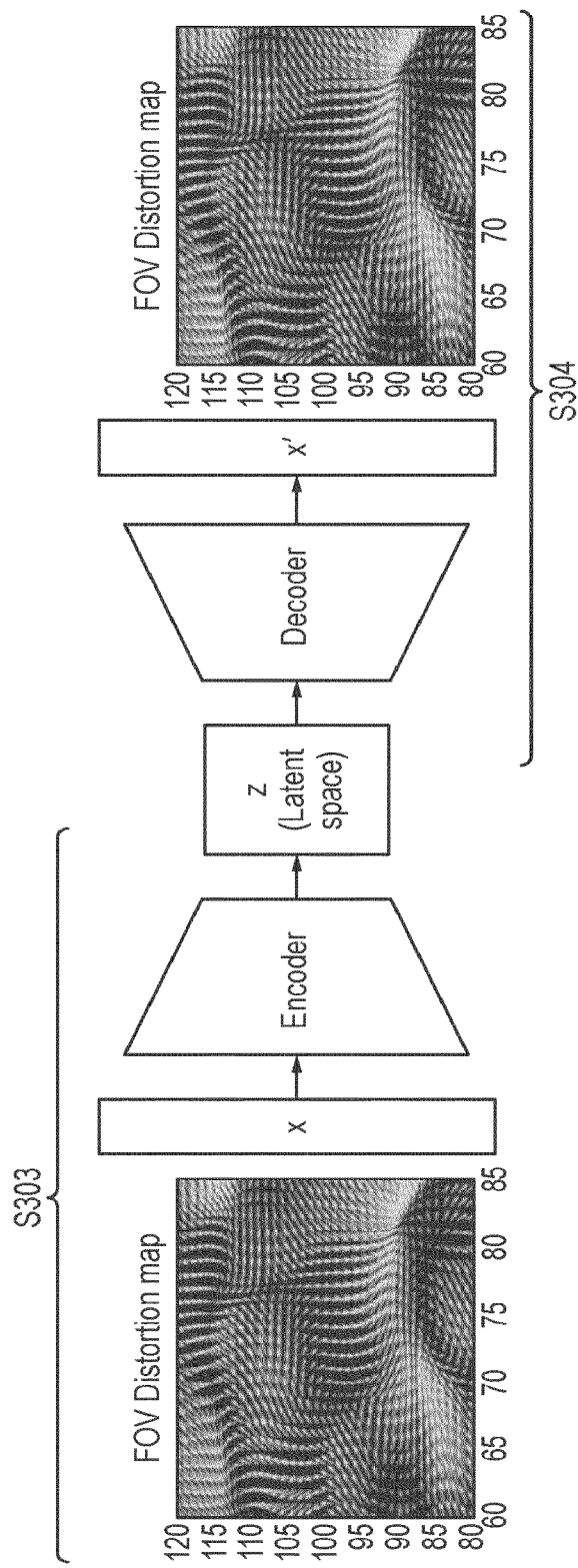
FIG. 7 depicts an illustration of the encoder-decoder network trained according to the method illustrated in FIG. 6.

The training images used in training the network may comprise distortion maps. FIG. 7 shows a schematic drawing illustrating steps S303 and S304 described above. In the illustration shown in FIG. 7, distortion maps are used in training the encoder-decoder network. As shown, the encoder encodes a distortion map into the latent space in step S303 and the decoder decodes the encoding out of the latent space in step S304. The encoder, E(x), converts the distortion map $x \in \mathbb{C}^m$ into a lower-dimensional, real-valued continuous latent vector $z \in \mathbb{R}^k$ (k<<n), where n is the dimensionality of the distortion map and k is the dimensionality of the latent space. The encoder also models the uncertainty of this latent vector. The decoder D(z) converts the continuous latent vectors back into a copy of the input distortion map x'. The aim of the training of the encoder-decoder network is to set the weightings of the encoder and decoder such that the decoder can decode out of the latent space to obtain an image which is as similar as possible to the image originally encoded by the encoder. The distortion maps used in the training process above may be measured or simulated distortion maps. Large uncertainty means the network is not confident about the predictions for particular distortion maps. The network can be made more confident by adding more examples of high uncertainty distortion maps to the training set, thereby guiding the training. This interactive training process is known as active learning.

The encoder-decoder network is thus taught how to encode distortion maps into a low dimensional latent space and given a low-dimensional input vector z, the decoder is able to generate new distortion maps D(z).

In any of the methods described above, the undistorted image may be obtained by computing the functional composition of the distorted image and the optimized distortion map.

In any of the examples discussed above, the reference image(s) and the distorted image(s) may be of a semiconductor substrate. In any of the examples discussed, the reference image may comprise a synthetic image. For example, the reference image may comprise an image rendered from a database, rather than an actual image of the substrate. For example, the synthetic image may be an image from the database used to manufacture a substrate. The reference image may thus be a synthetic image of the feature on the substrate.

In any of the examples discussed above, at least one of the reference image and distorted image may be obtained using a scanning electron microscope (for example a voltage contrast SEM or cross-section SEM) or a transmission electron microscope (TEM), scatterometer or the like.

In any of the methods described above for producing a distortion map based on a distorted image and a reference image, the distortion map produced by the methods may be used as a performance indicator. It may be used as an indicator for the performance of a metrology apparatus, e.g. a SEM. For example, when a distortion map is generated indicative of an unusually large level of distortion, this may indicate that the metrology apparatus is not functioning properly. Following such an indication, the metrology apparatus may be adjusted accordingly so as to perform more accurately.

The techniques disclosed herein can reduce the complexity of SEM processes.

The techniques disclosed herein can be used in in-line measurements for control loops and wafer disposition.

While specific techniques have been described above, it will be appreciated that the disclosure may be practiced otherwise than as described.

Some embodiments may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both.

There may also be provided a data storage medium (e.g., semiconductor memory, magnetic or optical disk) having such a computer program stored therein.

Although specific reference may have been made above to optical lithography, it will be appreciated that the techniques disclosed herein may be used in other applications, for example imprint lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Aspects of the present disclosure are set out in the following numbered clauses:

1. A method for determining an optimized weighting of an encoder and decoder network, the method comprising:
   for each of a plurality of test weightings, performing the following steps with the encoder and decoder operating using the test weighting:
   (a) encoding, using the encoder, a reference image and a distorted image into a latent space to form an encoding;
   (b) decoding the encoding, using the decoder, to form a distortion map indicative of a difference between the reference image and a distorted image;
   (c) spatially transforming the distorted image by the distortion map to obtain an aligned image;
   (d) comparing the aligned image to the reference image to obtain a similarity metric; and
   (e) determining a loss function which is at least partially defined by the similarity metric;
   wherein the optimized weighting is determined to be the test weighting which has an optimized loss function.
2. A method as defined in clause 1, wherein the optimized loss function corresponds to a maximum similarity between the aligned image and the reference image.

3. A method as defined in clause 1 or 2, wherein the loss function is further at least partially defined by a smoothness metric which is defined by the smoothness of the distortion map.
4. A method as defined in clause 3, wherein the smoothness metric is at least partially defined by the spatial gradients of the distortion map.
5. A method as defined in any one of clauses 1 to 4, wherein for each test weighting, steps (a)-(e) are repeated for a plurality of different combinations of reference images and distorted images, and wherein the loss function for a given test weighting is based on a combination of the loss functions determined for each of the different combinations of reference and distorted images.
6. A method as defined in clause 5, wherein the plurality of combinations comprises combinations of at least one reference image with a plurality of different distorted images.
7. A method as defined in clause 5 or 6, wherein the plurality of combinations comprises combinations of a plurality of different reference images with a plurality of different distorted images.
8. A method for aligning a distorted image, the method comprising:
   using an encoder-decoder network operating with an optimized weighting determined according to the method of clause 1 and performing the following:
   encoding, using the encoder, a reference image and a distorted image into a latent space to form an encoding;
   decoding, using the decoder, the encoding to form an optimized distortion map; and
   spatially transforming the distorted image using the distortion map so as to obtain an aligned image.
9. A method for aligning a distorted image, the method comprising:
   using a pre-trained encoder-decoder network trained to decode from the latent space to produce a distortion map and performing the following for each of a plurality of different test latent vectors:
   (a) spatially transforming the distorted image based on the respective test latent vector to provide a test aligned image;
   (b) comparing the test aligned image to a reference image;
   (c) obtaining a similarity metric based on the comparison of the aligned image and reference image;
   (d) determining an optimized latent vector which corresponds to the test latent vector which provides an optimized similarity metric;
   (e) determining an optimized distortion map by decoding the optimized latent vector with the pre-trained decoder; and
   (f) spatially transforming the distorted image by the optimized distortion map to output an aligned image.
10. A method as defined in clause 9, wherein similarity metric is determined by squaring the difference between the reference image and the test aligned image, and wherein the optimized latent vector corresponds to the test latent vector for which the similarity metric is minimized.
11. A method as defined in clause 9 or 10, wherein the pre-trained encoder-decoder network is trained by:
   (a) encoding training images into a latent space to form training encodings;
   (b) decoding the training encodings to form decoded images;
   (c) comparing the decoded images to the training images to obtain a training similarity metric;
   and wherein steps (a)-(c) are repeated for different weightings of the encoder-decoder network to find an optimized weighting in which the training similarity metric is optimized.
12. A method as defined in any one of clauses 1 to 11, wherein spatially transforming the distorted image by the optimized distortion map comprises determining the dot product of the distorted image and the distortion map.
13. A method as defined in any one of clauses 1 to 12, wherein the reference image and distorted image are of a semiconductor substrate.
14. A method as defined in any one of clauses 1 to 13, wherein at least one of the reference image and distorted image are obtained using a scanning electron microscope.
15. A method as defined in any one of clauses 1 to 14, wherein the reference image comprises a synthetic image (e.g. obtained from a database).
16. A method as defined in any one of clauses 1 to 15, wherein the training images comprise distortion maps.
17. An inspection tool comprising:
   an imaging system configured to image a portion of a semiconductor substrate; and
   an image analysis system configured to perform the method for aligning a distorted image according to as defined in any one of clauses 1 to 16.
18. A method of manufacture of a semiconductor substrate, the method comprising the steps of:
   manufacturing at least part of the semiconductor substrate;
   performing the method according to as defined in any one of clauses 1 to 16;
   analyzing the aligned image to obtain a metric of the image; and
   comparing the metric to a target metric and taking remedial action when the metric does not meet the target metric.
19. An inspection tool comprising:
   an imaging system configured to capture an image of a portion of a semiconductor substrate; and
   an image analysis system configured to reduce distortion in an image captured by the imaging system by determining an optimized weighting of a network comprising an encoder and a decoder, wherein the image analysis system is configured to:
   for each of a plurality of test weightings, perform the following steps with the encoder and decoder operating using the test weighting:
   encoding, using the encoder, a reference image and a distorted image into a latent space to form an encoding;
   decoding the encoding, using the decoder, to form a distortion map indicative of a difference between the reference image and a distorted image;
   spatially transforming the distorted image by the distortion map to obtain an aligned image;
   comparing the aligned image to the reference image to obtain a similarity metric; and
   determining a loss function which is at least partially defined by the similarity metric;

wherein the optimized weighting is determined to be the test weighting which has an optimized loss function.
20. An inspection tool as defined in clause 19, wherein the optimized loss function corresponds to a maximum similarity between the aligned image and the reference image.
21. An inspection tool as defined in clause 19 or 20, wherein the loss function is further at least partially defined by a smoothness metric which is defined by the smoothness of the distortion map.
22. An inspection tool as defined in clause 21, wherein the smoothness metric is at least partially defined by the spatial gradients of the distortion map.
23. An inspection tool as defined in any one of clauses 19 to 22, wherein for each test weighting, steps (a)-(e) are repeated for a plurality of different combinations of reference images and distorted images, and wherein the loss function for a given test weighting is based on a combination of the loss functions determined for each of the different combinations of reference and distorted images.
24. An inspection tool as defined in clause 23, wherein the plurality of combinations comprises combinations of at least one reference image with a plurality of different distorted images.
25. An inspection tool as defined in clause 23, wherein the plurality of combinations comprises combinations of a plurality of different reference images with a plurality of different distorted images.
26. An inspection tool as defined in any one of clauses 19 to 25 wherein the image analysis system is further configured to:
use the network with the optimized weighting to:
encode, using the encoder, a reference image and a distorted image into a latent space to form an encoding;
decode, using the decoder, the encoding to form an optimized distortion map; and
spatially transform the distorted image using the distortion map so as to obtain an aligned image.
27. An inspection tool comprising:
an imaging system configured to capture an image of a portion of a semiconductor substrate; and
an image analysis system configured to align a distorted image captured by the imaging system, the image analysis system comprising a pre-trained encoder-decoder network trained to decode from the latent space to produce a distortion map and configured to perform the following for each of a plurality of different test latent vectors:
spatially transform the distorted image based on the test latent vector to provide a test aligned image;
compare the test aligned image to a reference image;
obtain a similarity metric based on the comparison of the aligned image and reference image;
determine an optimized latent vector which corresponds to the test latent vector which provides an optimized similarity metric;
determine an optimized distortion map by decoding the optimized latent vector with the pre-trained decoder; and
spatially transform the distorted image by the optimized distortion map to output an aligned image.
28. An inspection tool as defined in clause 27, wherein the similarity metric is determined by squaring the difference between the reference image and the test aligned image, and wherein the optimized latent vector corresponds to the test latent vector for which the similarity metric is minimized.
29. An inspection tool as defined in clause 27, wherein the pre-trained encoder-decoder network is trained by:
(a) encoding training images into a latent space to form training encodings;
(b) decoding the training encodings to form decoded images;
(c) comparing the decoded images to the training images to obtain a training similarity metric;
and wherein steps (a)-(c) are repeated for different weightings of the encoder-decoder network to find an optimized weighting in which the training similarity metric is optimized.
30. An inspection tool as defined in any one of clauses 19 to 29, wherein spatially transforming the distorted image by the optimized distortion map comprises determining the dot product of the distorted image and the distortion map.
31. An inspection tool as defined in any one of clauses 19 to 30, wherein the reference image and distorted image are of a semiconductor substrate.
32. An inspection tool as defined in any one of clauses 19 to 31, wherein at least one of the reference image and distorted image are obtained using a scanning electron microscope.
33. An inspection tool as defined in any one of clauses 19 to 32, wherein the reference image comprises a synthetic image (e.g., obtained from a database).
34. A computer program (desirably embodied in a non-transitory computer readable medium) comprising code that, when executed by a computer system, instruct the computer system to perform a method of determining an optimized weighting of an encoder and decoder network, the method comprising:
for each of a plurality of test weightings, performing the following steps with the encoder and decoder operating using the test weighting:
(a) encoding, using the encoder, a reference image and a distorted image into a latent space to form an encoding;
(b) decoding the encoding, using the decoder, to form a distortion map indicative of a difference between the reference image and a distorted image;
(c) spatially transforming the distorted image by the distortion map to obtain an aligned image;
(d) comparing the aligned image to the reference image to obtain a similarity metric; and
(e) determining a loss function which is at least partially defined by the similarity metric;
wherein the optimized weighting is determined to be the test weighting which has an optimized loss function.
35. A computer program (desirably embodied in a non-transitory computer readable medium) comprising code that, when executed by a computer system, instruct the computer system to perform a method for aligning a distorted image, the method comprising:
using a pre-trained encoder-decoder network trained to decode from the latent space to produce a distortion map and performing the following for each of a plurality of different test latent vectors:
(a) spatially transforming the distorted image based on the test latent vector to provide a test aligned image;

(b) comparing the test aligned image to a reference image;

(c) obtaining a similarity metric based on the comparison of the aligned image and reference image;

(d) determining an optimized latent vector which corresponds to the test latent vector which provides an optimized similarity metric;

(e) determining an optimized distortion map by decoding the optimized latent vector with the pre-trained decoder; and (f) spatially transforming the distorted image by the optimized distortion map to output an aligned image.

36. A method for aligning a distorted image, the method comprising:

using an encoder-decoder network operating with an optimized weighting to perform the following:

encoding, using the encoder, a reference image and a distorted image into a latent space to form an encoding;

decoding, using the decoder, the encoding to form an optimized distortion map; and spatially transforming the distorted image using the distortion map so as to obtain an aligned image.

Having described embodiments of the invention it will be appreciated that variations thereon are possible within the spirit and scope of the disclosure and the appended claims as well as equivalents thereto.

The invention claimed is:

1. An inspection tool comprising:

an imaging system configured to capture an image of a portion of a semiconductor substrate; and an image analysis system configured to reduce distortion in an image captured by the imaging system by determining an optimized weighting of a network comprising an encoder and a decoder, wherein the image analysis system is configured to:

for each of a plurality of test weightings, perform the following steps with the encoder and decoder operating using the test weighting:

(a) encoding, using the encoder, a reference image and a distorted image into a latent space to form an encoding;

(b) decoding the encoding, using the decoder, to form a distortion map indicative of a difference between the reference image and a distorted image;

(c) spatially transforming the distorted image by the distortion map to obtain an aligned image;

(d) comparing the aligned image to the reference image to obtain a similarity metric; and (e) determining a loss function which is at least partially defined by the similarity metric;

wherein the optimized weighting is determined to be the test weighting which has an optimized loss function.

2. An inspection tool as claimed in claim 1, wherein the optimized loss function corresponds to a maximum similarity between the aligned image and the reference image.

3. An inspection tool as claimed in claim 1, wherein the loss function is further at least partially defined by a smoothness metric which is defined by the smoothness of the distortion map.

4. An inspection tool as claimed in claim 3, wherein the smoothness metric is at least partially defined by the spatial gradients of the distortion map.

5. An inspection tool as claimed in claim 1, wherein for each test weighting, steps (a)-(e) are repeated for a plurality of different combinations of reference images and distorted images, and wherein the loss function for a given test weighting is based on a combination of the loss functions determined for each of the different combinations of reference and distorted images.

6. An inspection tool as claimed in claim 5, wherein the plurality of combinations comprises combinations of at least one reference image with a plurality of different distorted images.

7. An inspection tool as claimed in claim 5, wherein the plurality of combinations comprises combinations of a plurality of different reference images with a plurality of different distorted images.

8. An inspection tool as claimed in claim 1 wherein the image analysis system is further configured to:

use the network with the optimized weighting to:

encode, using the encoder, a reference image and a distorted image into a latent space to form an encoding;

decode, using the decoder, the encoding to form an optimized distortion map; and spatially transform the distorted image using the distortion map so as to obtain an aligned image.

9. An inspection tool comprising:

an imaging system configured to capture an image of a portion of a semiconductor substrate; and an image analysis system configured to align a distorted image captured by the imaging system, the image analysis system comprising a pre-trained encoder-decoder network trained to decode from the latent space to produce a distortion map and configured to perform the following for each of a plurality of different test latent vectors:

spatially transform the distorted image based on the respective test latent vector to provide a test aligned image;

compare the test aligned image to a reference image;

obtain a similarity metric based on the comparison of the aligned image and reference image;

determine an optimized latent vector which corresponds to the test latent vector which provides an optimized similarity metric;

determine an optimized distortion map by decoding the optimized latent vector with the pre-trained decoder; and spatially transform the distorted image by the optimized distortion map to output an aligned image.

10. An inspection tool as claimed in claim 9, wherein the similarity metric is determined by squaring the difference between the reference image and the test aligned image, and wherein the optimized latent vector corresponds to the test latent vector for which the similarity metric is minimized.

11. An inspection tool as claimed in claim 9, wherein the pre-trained encoder-decoder network is trained by:

(a) encoding training images into a latent space to form training encodings;

(b) decoding the training encodings to form decoded images;

(c) comparing the decoded images to the training images to obtain a training similarity metric;

and wherein steps (a)-(c) are repeated for different weightings of the encoder-decoder network to find an optimized weighting in which the training similarity metric is optimized.

12. An inspection tool as claimed in claim 9, wherein spatially transforming the distorted image by the optimized distortion map comprises determining the dot product of the distorted image and the distortion map.

13. An inspection tool as claimed in claim 9, wherein the reference image and distorted image are of a semiconductor substrate.

14. An inspection tool as claimed in claim 9, wherein at least one of the reference image and distorted image are obtained using a scanning electron microscope.

15. An inspection tool as claimed in claim 9, wherein the reference image comprises a synthetic image.

* * * * *